(12) United States Patent
Sugihwo et al.

(10) Patent No.: US 6,380,531 B1
(45) Date of Patent: Apr. 30, 2002

(54) WAVELENGTH TUNABLE NARROW LINEWIDTH RESONANT CAVITY LIGHT DETECTORS

(75) Inventors: Fred Sugihwo, San Francisco; James S. Harris, Jr., Stanford, both of CA (US)

(73) Assignee: The Board of Trustees of The Leland Stanford Junior University, Stanford, CA (US)

( * ) Notice: Subject to any disclaimer, the term of this patent is extended or adjusted under 35 U.S.C. 154(b) by 0 days.

(21) Appl. No.: 09/451,470

(22) Filed: Nov. 30, 1999

Related U.S. Application Data

(60) Provisional application No. 60/110,869, filed on Dec. 4, 1998.

(51) Int. Cl.[7] .............................................. H01L 31/00
(52) U.S. Cl. ....................... 250/214.1; 257/436; 257/21
(58) Field of Search ........................ 250/214.1, 370.14, 250/338.4, 338.1; 257/436, 437, 440, 16, 21

(56) References Cited

U.S. PATENT DOCUMENTS 5,291,055 A * 3/1994 Farhoomand et al. ....... 257/437
5,315,128 A * 5/1994 Hunt et al. ................... 257/16

* cited by examiner

*Primary Examiner*—Que T. Le
*Assistant Examiner*—Thanh X. Luu
(74) *Attorney, Agent, or Firm*—Lumen Intellectual Property Services

(57) ABSTRACT

A light detector comprising a photodetector disposed within an etalon or microcavity. The light detector is sensitive to light having a wavelength resonant with the etalon. Preferably, the etalon is a solid state microcavity having distributed bragg reflectors. The photodetector may be a photodiode, phototransistor or the like. The etalon has a front reflector with reflectivity $R_f$ and a back reflector with reflectivity $R_b$. The photodetector has a double-pass absorption of A. In the present invention, $R_f$, $R_b$, and A are selected such that $R_f = R_b(1-A)$. The combination of the back reflector and absorbing photodetector is indistinguishable from a single reflector of reflectivity $R_f$. Therefore, the light detector behaves like an etalon with matched reflectors. Preferably, $R_f$ is greater than 0.95 and $R_b$ is greater than 0.98. The photodetector can have a relatively thin absorption layer, thereby providing high speed capability. Even with a low absorption, the photodetector provides high quantum efficiency since it is within the etalon. Preferably, the front reflector is movable such that an etalon cavity length is adjustable. This provides for adjustment of the wavelength at which the light detector is sensitive.

22 Claims, 6 Drawing Sheets

WAVELENGTH TUNABLE NARROW LINEWIDTH RESONANT CAVITY LIGHT DETECTORS

RELATED APPLICATIONS

The present application claims priority from copending provisional application 60/110,869, filed on Dec. 04, 1998, which is hereby incorporated by reference.

This invention was supported in part by grant number DAAG55-971-0002 from the U.S. Army. The Government has certain rights in the invention.

FIELD OF THE INVENTION

This invention relates generally to light detectors. More specifically, this invention relates to precision, wavelength tunable light detectors that can be used in fiber optic communications and spectroscopy.

BACKGROUND OF THE INVENTION

Wavelength division multiplexing (WDM) is a technology used in fiber optic communications to increase the data capacity of an optical fiber. In WDM, several distinct wavelengths are simultaneously passed through the optical fiber. Each wavelength corresponds to a single channel. In order to implement WDM, an array of lasers is required at the transmitting end of the fiber, and an array of photodetectors is required at the receiving end. Each laser and each photodetector is tuned to a certain wavelength. Semiconductor lasers are typically used as transmitters, and the linewidth of such lasers is quite narrow, typically about 0.1–1.0 Ghz, or 0.003–0.033 Angstroms. The linewidth of semiconductor lasers is not the limiting factor in the channel spacing (channels per unit wavelength). Rather, the channel spacing is limited by current receiver technologies.

Typical receivers for WDM systems have a diffraction grating that separates optical signals into distinct wavelengths. In such systems, the channel spacing typically must be at least 2 nm for adequate resolution. Also, it is important for photodetectors in WDM applications to have high sensitivity and high speed operation. Present photodetectors cannot provide high speed, high sensitivity and narrow linewidth sensitivity. In particular, photodetectors having a linewidth narrower than 2 nm would therefore be quite useful in WDM systems.

Some WDM systems have a graded photodetector array with each photodetector having a different physical structure (e.g. material composition) rendering each photodetector sensitive to a distinct wavelength range. Typically, the arrays are made by nonuniformly distributing dopants onto a substrate wafer. The concentration of the dopant influences the wavelength range of the photodetectors. It is difficult to nonuniformly and precisely affect the properties of the photodetectors on a single substrate. Therefore, such photodetectors arrays have a high cost.

Another problem with graded photodetectors arrays is that since each photodetector is unique, each photodetector requires a backup duplicate for reliability. This also tends to increase the cost of graded array WDM systems. It would be an advance in the art of WDM systems to provide photodetectors arrays that provide high reliability with a reduced number of photodetectors. In particular, it would be an advance in the art of WDM systems to provide photodetectors that can replace any other photodetector in a WDM photodetector array.

Also, it would be an advance in the art of photodetectors generally to provide photodetectors having a combination of high speed and high sensitivity. Presently, solid state photodetector designs present undesirable performance tradeoffs between speed and sensitivity. It would be particularly useful for such devices to have narrow bandwidth.

It would also be an advance in the art of photodetectors to provide tunability in a solid state photodetector. Tunable photodetectors could be used in a wide range of applications, particularly if they have high speed, high sensitivity, and narrow bandwidth.

Photodetectors with a combination of high speed, high sensitivity, tunability and narrow bandwidth could be used in a wide range of applications including WDM, spectroscopy, and free space optical interconnections.

OBJECTS AND ADVANTAGES OF THE INVENTION

Accordingly, it is a primary object of the present invention to provide a photodetector that:
1) has a narrow linewidth;
2) has a high quantum efficiency and high sensitivity;
3) has a high speed;
4) is tunable over a broad range of wavelengths;
5) is suitable for dense wavelength division multiplexing applications and spectroscopy applications; and
6) provides gain.

These and other objects and advantages will be apparent upon reading the following description and accompanying drawings.

SUMMARY OF THE INVENTION

These objects and advantages are attained by an apparatus for detecting light having a front reflector for receiving incident light. The front reflector has a reflectivity of Rf. The apparatus also has a back reflector with reflectivity Rb. The front and back reflectors are aligned to form an optical resonator. A photodetector is disposed within the resonator, and the photodetector has a double pass absorption of A. In the present invention, a ratio Rf/Rb is equal to the value (1−A) to within 10%.

Preferably, Rf is greater than 75%, more preferably 90%, or most preferably 98%. Also, the ratio $R_f/R_b$ is preferably within 5% of the value (1−A), more preferably within 1% of the value (1−A).

Preferably, the double pass absorption is less than 25%, 10%, 5%, or 2%. Smaller values are more preferred.

Preferably, the resonator is an optical microcavity. Preferably, the distance between the front and back reflectors is less than 10 microns, more preferably, less than 2 microns.

The photodetector can be a PIN photodiode, phototransistor, avalanche photodiode or any other photodiode photodiode. The photodetector may comprise a quantum well.

The photodetector can comprise a discrete absorption layer. Preferably, the absorption layer is less than 300 nm thick, more preferably, less than 100 or 50 nm thick.

Preferably, at least one of the reflectors is movable such that a distance between the front reflector and back reflector is adjustable and the device is tunable. A flexible membrane can provide tunability.

The reflectors can be distributed Bragg reflectors.

DETAILED DESCRIPTION

The present invention includes light detectors that are tunable as well as light detectors that are not tunable. The light detectors of the present invention comprise a solid state photodetector disposed within a Fabry-Perot etalon (an optical resonator). In a preferred embodiment of the invention, the etalon has a movable reflector to vary a cavity spacing of the etalon.

Figure 1:
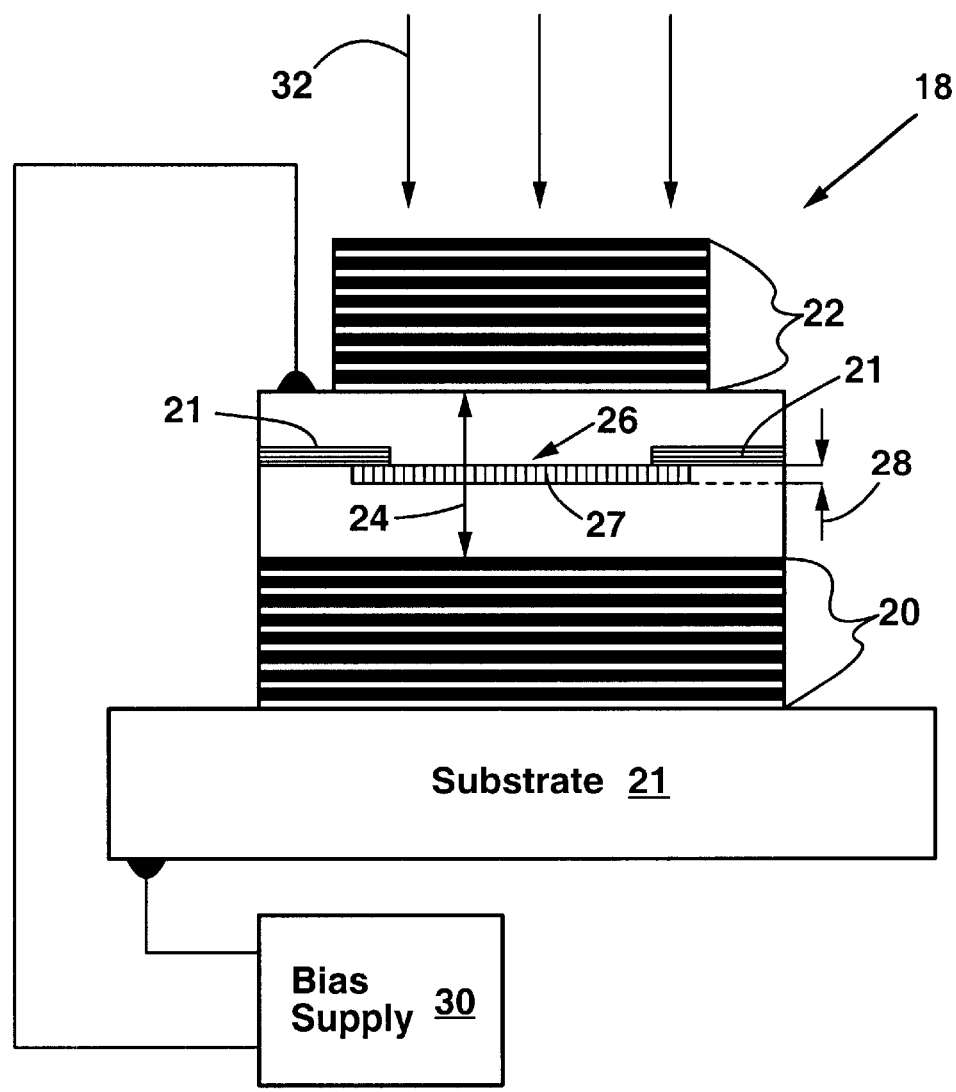
FIG. 1 is a cross sectional side view of a nontunable embodiment of the present invention.

FIG. 1 shows a solid state, nontunable light detector 18 according to the present invention. The light detector has a back reflector 20 and a front reflector 22 fabricated upon a semiconductor substrate 21 such as Gallium Arsenide. The reflectors 20, 22 define a Fabry Perot etalon cavity 24. The cavity 24 may be made of AlAs, GaAs, or a ternary alloy of the two. The reflectors 20, 22 and cavity 24 may be made using well known techniques within the art of molecular beam epitaxy and metal organic chemical vapor deposition. The cavity 24 is relatively short (on the order of 1–2 microns or less), and therefore has only one longitudinal cavity mode relevant to the present discussion. The light detector 18 is only sensitive to light at a resonant wavelength $\lambda$ resonant with the cavity mode.

The reflectors 20, 22 are distributed Bragg reflectors (DBRs) having alternating layers of dissimilar materials (e.g. AlAs and GaAs). The reflectors 20, 22 are reflective to the resonant wavelength $\lambda$. The back reflector 20 is made as reflective as is practically possible. In a particular device, the back reflector 20 has 22.5 AlAs/GaAs layer pairs and a reflectivity of 99.875% at 970 nm, the resonant wavelength of the particular device. Preferably, the back reflector has a reflectivity of at least 90%, more preferably, at least 99%.

Located between the reflectors 20, 22 within the etalon cavity 24 is a solid state photodetector 26. The photodetector is absorptive at the resonant wavelength. The photodetector can be any type of solid state photodetector such as a photodiode, PIN photodiode, avalanche photodiode (APD), or phototransistor. Preferably, an APD or phototransistor is used because they provide gain. Gain is beneficial for many applications because it increases light detector sensitivity. Phototransistors are particularly preferred because they tend to be less noisy than APDs. The photodetector 26 may include quantum wells as part of the absorbing layer 27, as is known in the art.

An electrical bias supply 30 provides voltage for operating the photodetector 26. Optionally, a current aperture 21 made of dielectric material (e.g. oxidized AlAs) confines current to a region between the front and back reflectors. The current aperture may not be necessary if incident light 32 is focused to a point smaller than the reflectors 20, 22.

Portions of the cavity 24 outside the photodetector 26 (in a vertical direction) are made of a material that has a high bandgap energy and is therefore transparent (i.e. nonabsorptive) to the resonant wavelength.

The photodetector 26 has a known absorption coefficient $\alpha$ at the wavelength of interest, $\lambda$. The photodetector also has an absorption layer 27 of known thickness X 28. The photodetector absorption A at wavelength $\lambda$ for a round trip pass through the etalon cavity 24 is then given by:

$$A = 1 - e^{-2\alpha X}. \quad \text{Eqn 1}$$

It is important to note that the absorption A is also dependent upon the location of the photodetector 26 within the cavity 24. The absorption will be relatively low if the photodetector is located at a cavity node. The absorption will be relatively high if the photodetector is located at a cavity antinode. According to the present invention, the front reflector 22 has a reflectivity $R_f$ approximately equal to:

$$R_f = R_b e^{-2\alpha X},$$

or $$R_f = R_b(1-A). \quad \text{Eqns 2a, 2b}$$

Where $R_b$ is the back reflector reflectivity. These equations define what is referred to in the present specification as the matching condition. Preferably, $R_b$ is very close to 1.0. The front reflector reflectivity $R_f$ is therefore about equal to $(1-A)$, or about equal to the double pass transmission through the photodetector 26. Preferably, the absorption A is less than about 0.25 (25%), more preferably, the absorption is less than 10%, more preferably still the absorption is less than 5%, and most preferably the absorption is less than 2%. A low absorption A provides that the etalon cavity 24 has a high finesse and narrow sensitivity linewidth.

The matching condition can also be defined by the equality $R_f/R_b = (1-A)$. According to the present invention, the ratio $R_f/R_b$ must be within 15% of the value of 1–A. More preferably, the ratio $R_f/R_b$ is within 10% of $(1-A)$ or 5% of $(1-A)$. In the present invention, it is best for the quantity $R_f/R_b$ to be as close as possible to the quantity $(1-A)$.

In operation, light to be detected 32 is incident upon the front reflector 22. Wavelengths that are not resonant with the longitudinal mode are strongly reflected from the front reflector 22. If the incident light is at the resonant wavelength, then a circulating beam is excited within the etalon cavity 24. The matching condition of Eqs 2a/2b results in the etalon behaving like a resonator with two identical reflectors of reflectivity $R_f$. This is because the absorptive photodetector 26 and back reflector 20 in combination are indistinguishable from a single reflector of reflectance $R_f$. The light detector built according to the matching condition has the highest possible light intensity within the cavity for a given $R_f$ and $R_b$. Therefore, the matching condition provides the highest possible quantum efficiency for any choice of $R_f$ and $R_b$.

Figure 2:
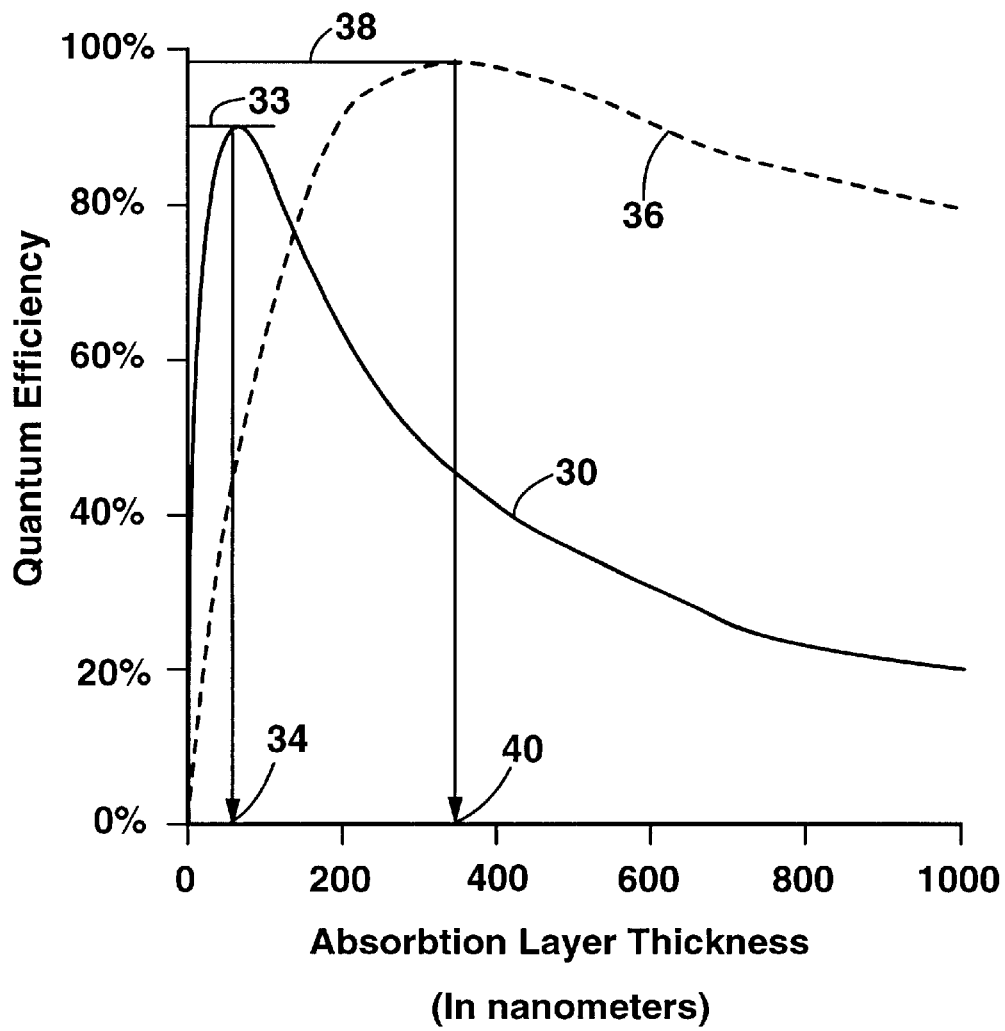
FIG. 2 is a graph showing quantum efficiency versus photodetector absorption layer thickness for two families of devices. The effect of the matching condition on quantum efficiency can be easily seen.

FIG. 2 shows a plot of quantum efficiency at the resonant wavelength vs. absorption layer thickness 28 for two different front reflector reflectivities (Rf). In these example plots, the absorption layer has an absorption coefficient $\alpha$ of $10^4$/cm so the absorption is only a function of the absorbing layer thickness 28 (other effects, such as absorption layer location, are assumed to remain constant). Curve 30 shows the quantum efficiency for a light detector with $R_f$=0.9 and $R_b$=0.99. A maximum quantum efficiency 33 of about 90% occurs for an absorbing layer thickness of about 50 nm 34. This is the thickness for an absorbing layer which has A=0.1, which satisfies equations 2a and 2b (i.e., the matching condition). Curve 36 shows the quantum efficiency for a light detector with $R_f$=0.5 and $R_b$=0.99. A maximum quantum efficiency 38 of about 98% occurs for an absorbing layer thickness of about 340 nm 40. This is the thickness for an absorbing layer which has A=0.5, which satisfies the matching condition. The quantum efficiency for both curves asymptotically approaches a value of approximately $(1-R_f)$ as absorption layer thickness 28 increases. Of course, all these plots are for the resonant wavelength λ.

Given that the matching condition is satisfied, the maximum achievable quantum efficiency increases monotonically with decrease in $R_f$ (and increases monotonically with increase in absorption). For example, maximum quantum efficiency 38 for $R_f$=0.5 is greater than maximum quantum efficiency 33 for $R_f$=0.9.

Increasing the absorption of the absorbing layer 27 beyond the matching condition of equations 2a and 2b results in a weaker field reflected by the back reflector 20. This reduces the intensity of the circulating beam within the cavity 24, thereby reducing the quantum efficiency. In the limit as absorption A approaches 1, the light detector 18 operates simply as a photodetector located behind a reflector of reflectivity $R_f$.

For a given intensity of incident light 32 and given photodetector absorption, the matching condition results in the circulating beam within the cavity 24 having a maximum possible intensity. A high intensity circulating beam results in a high proportion of the circulating beam being absorbed by the photodetector 26, and therefore a high quantum efficiency.

One of the great advantages of the present invention is that the absorbing layer 27 can be very thin and the detector 18 still provides high quantum efficiency and high sensitivity. A thin absorbing layer 27 provides high speed capability because charge carriers can traverse the layer thickness 28 in less time. The absorbing layer 27 can be thin because the absorption A can be relatively small while still providing high quantum efficiency. Therefore, light detectors of the present invention can have the beneficial combination of high speed, high quantum efficiency, and high sensitivity. In a preferred embodiment of the present invention, the absorbing layer is less than 300 nanometers thick. In a particularly preferred embodiment, the absorbing layer 27 is less than 100 nanometers, or, most preferably, less than 50 nanometers thick. The absorbing layer 27 can even be less than 12 nanometers thick, and thereby function as a quantum well. An absorbing layer 27 less than 100 nanometers thick can provide operation at frequencies exceeding about 10 Ghz, depending upon the semiconductor material used for the absorbing layer 27 and photodetector 26.

The thin absorption layer 27 and high quantum efficiency of the present light detector is in contrast to conventional photodetectors. Conventional photodetectors require a thick, highly absorptive absorbing region in order to have a high quantum efficiency and high sensitivity. A thick absorbing region severely limits operation at high speed due to a resultant long carrier transit time.

Figure 3:
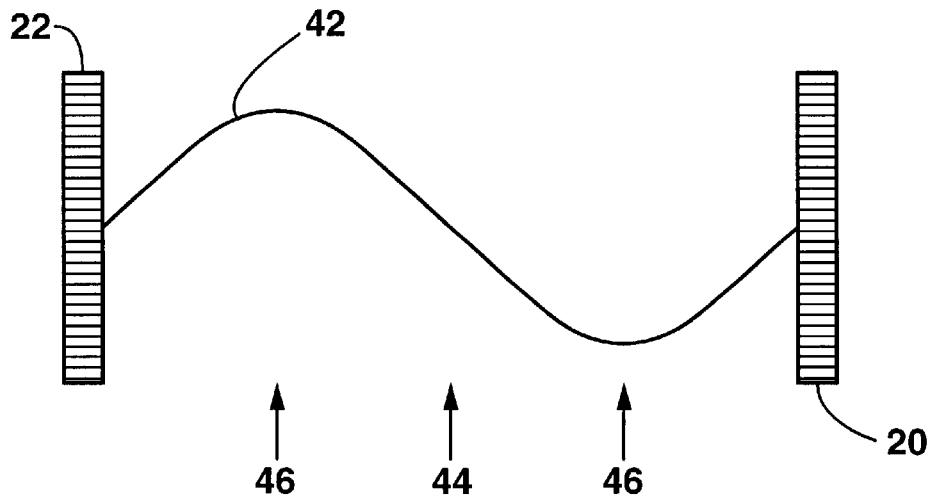
FIG. 3 is a side view of an etalon illustrating cavity nodes and antinodes

The location of the absorbing layer 27 within the cavity has an effect upon the absorption A. FIG. 3 shows an idealized side view of a circulating optical standing wave 42 between the reflectors 20, 22. Locating the absorbing layer 27 at a node 44 of the standing wave will result in reduced absorption, and locating the absorbing layer 27 at an antinode 46 will result in increased absorption. A thin absorbing layer 27 located at antinode 46 can provide the same absorption as a thick absorbing layer located at the node 44. Therefore, higher speed operation of the photodetector 26 can be achieved if the photodetector is located at one of the antinodes 46.

Another important factor in the design of light detectors according to the present invention is the linewidth of the light detector 18. For many applications in spectroscopy and wavelength division multiplexing, it is desirable to have a very narrow linewidth (e.g. less than 2 nm). The linewidth (full width at half-maximum) of the light detector 18 is equal to the free spectral range (FSR) of the cavity 24 divided by the finesse (F) of the cavity. Linewidth is narrower for higher finesse values. For $R_b$~1, and given the matching condition is satisfied, the finesse F is approximately given by:

$$F=\pi^{1-\alpha X}/2\alpha X.$$

Therefore, the linewidth is narrower for reduced absorption and higher front reflectivity $R_f$ ($R_f$ does not appear in the equation since it is determined by the absorption). For a typical value of 0.012=αX, finesse=130, and a free spectral range of 100 nm a linewidth of 0.7 nm is provided (near a resonant wavelength of 970 nm).

To summarize, the light detectors of the present invention can have a combination of high speed, narrow linewidth, high quantum efficiency, and high sensitivity. These benefits are provided simultaneously since the photodetector can have a thin absorbing layer of low absorption, and the matching condition provides a high quantum efficiency.

A shortcoming of the light detector 18 of FIG. 1 is that the resonant wavelength is sensitive to temperature changes. The monolithic design of the light detector of FIG. 1 results in changes in an effective cavity length with temperature. The changes in effective cavity length result in changes in the resonant wavelength of the cavity and therefore the wavelength at which the detector is sensitive. Since the light detector 18 can have a rather narrow linewidth (e.g. less than 2 nm), the changes in resonant wavelength can be substantial compared to the linewidth. For resonant wavelength stability, the light detector 18 must be held at constant temperature. This characteristic is very undesirable for precision applications such as light detectors in fiber optic communications systems.

Figure 4:
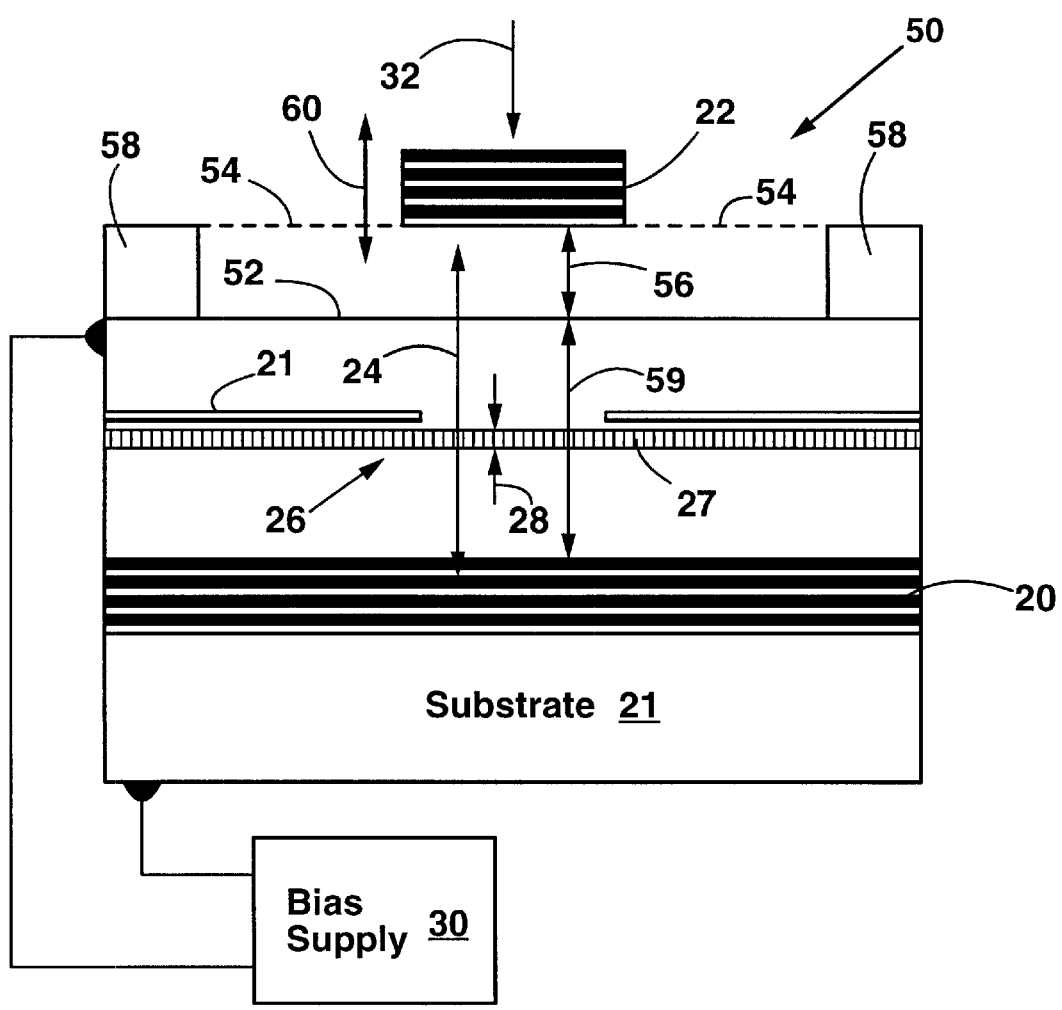
FIG. 4 is a cross sectional side view of a preferred embodiment of the present invention where the light detector is tunable.

FIG. 4 shows a cross sectional side view of a wavelength-tunable light detector 50 according to a preferred embodiment of the present invention. The tunable characteristic of detector 50 allows temperature sensitivity problems to be avoided. In the embodiment of FIG. 4, the front reflector 22 is suspended above a top surface 52 by a flexible membrane 54. The membrane 54 is held above the top surface 52 by micromachined posts 58. The distance of the front reflector 22 above the top surface is indicated by an air gap spacing 56. The membrane 54 is flexible and may be made of a thin film of metal. The front reflector 22 may comprise a DBR made, for example, from alternating layers of silicon oxide and silicon nitride. The air gap 56 is part of the cavity 24.

The air gap spacing 56 and cavity 24 are adjustable by applying an electrostatic voltage between the membrane 54 and top surface 52. The front reflector 22 moves vertically in direction 60 when the voltage is adjusted. Changing the air gap 56 changes the resonant wavelength to which the detector 50 is sensitive. The light detector is tunable by adjusting a voltage applied between the membrane 54 and top surface 52.

Figure 5:
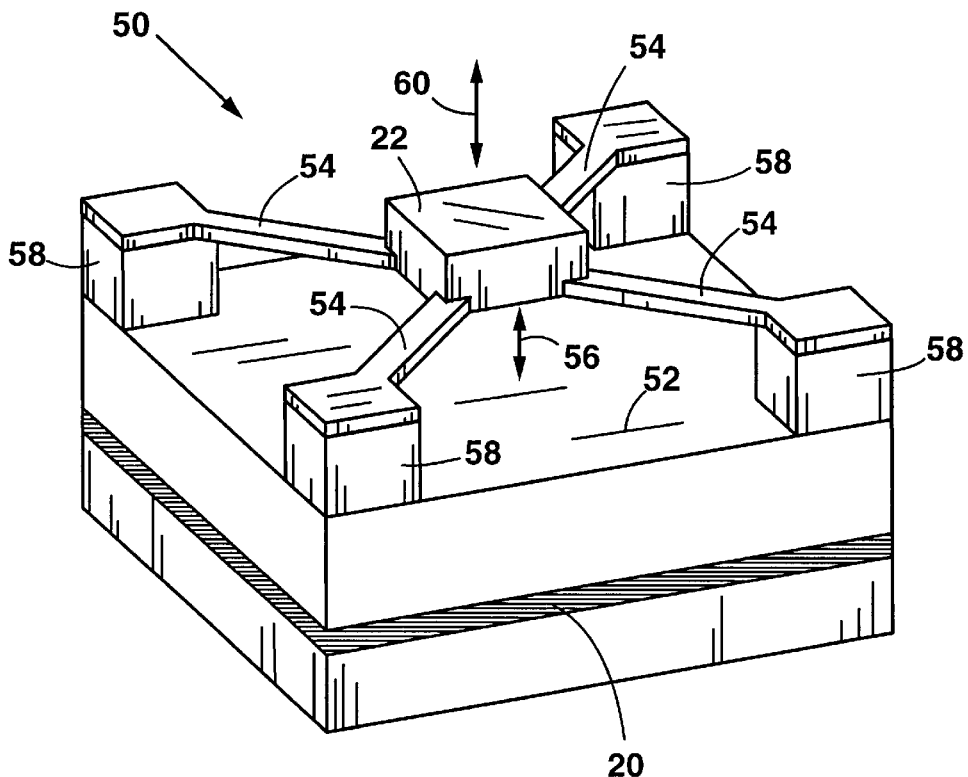
FIG. 5 is a perspective view of the embodiment of FIG. 4.

FIG. 5 shows a perspective view of the light detector 50 of FIG. 4. The front reflector 22 moves in direction 60 when voltages are applied between the membrane 54 and top surface 52. reference can be made to Fred Sugihwo, et al. *Journal of Microelectromechanical Systems*, Vol. 7, pp. 48–55, Mar. 1998 for information on how to fabricate and operate the suspended reflector structure shown in FIGS. 4 and 5.

The tunable light detector 50 of FIGS. 4 and 5 does not need to be operated at a constant temperature for resonant wavelength stability. Resonant wavelength stability is provided by adjusting the air gap 56 as the ambient temperature changes.

Figures 6A, 6B:
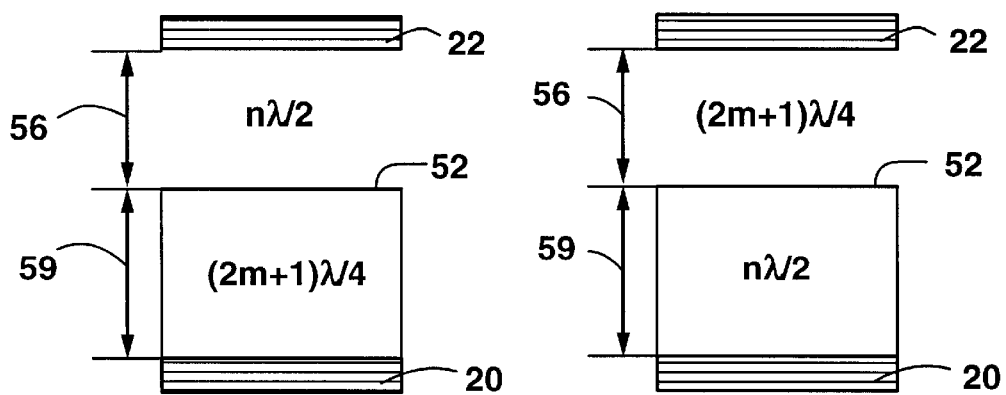
FIGS. 6a, 6b, and 6c illustrate different cavity designs possible for the tunable embodiment of FIGS. 4 and 5.

The cavity 24 is divided into the air gap 56 and a solid state gap 59. The lengths of the gaps 56 and 59 has a strong influence on the distribution of optical energy within the cavity. Whether or not an antireflection coating is disposed on the top surface also influences the distribution of optical energy within the cavity. FIGS. 6a–6b show three examples of different designs for the cavity 24.

FIG. 6a shows a cavity design known as an air-coupled cavity. The air gap 56 has a length equal to an integral number of half wavelengths, or $n\lambda/2$, where n is an integer. The solid state gap 59 has a length equal to an odd number of quarter wavelengths, or $(2m+1)\lambda/4$, where m is an integer. An air coupled cavity tends to concentrate the optical energy within the air gap 56. The optical intensity within the solid state gap 59 is relatively low. Therefore, small changes in the air gap spacing will result in large changes in the resonant wavelength. A light detector device with an air coupled cavity is rather sensitive to changes in the air gap spacing. Also, an air coupled cavity design tends to have a low absorption since most of the optical energy is in the air gap 56.

FIG. 6b shows a cavity design known as a semiconductor coupled cavity. The air gap 56 has a length equal to an odd number of quarter wavelengths, or $(2m+1)\lambda/4$, where m is an integer. The solid state gap 59 has a length equal to an integral number of half wavelengths, or $n\lambda/2$, where n is an integer. A semiconductor coupled cavity tends to concentrate the optical energy within the solid state gap 59. The optical intensity within the air gap 56 is relatively low. Therefore, a relatively large change in the air gap spacing is required to change the resonant wavelength substantially. A light detector device with a semiconductor coupled cavity is rather insensitive to changes in the air gap spacing.

Figure 6C:
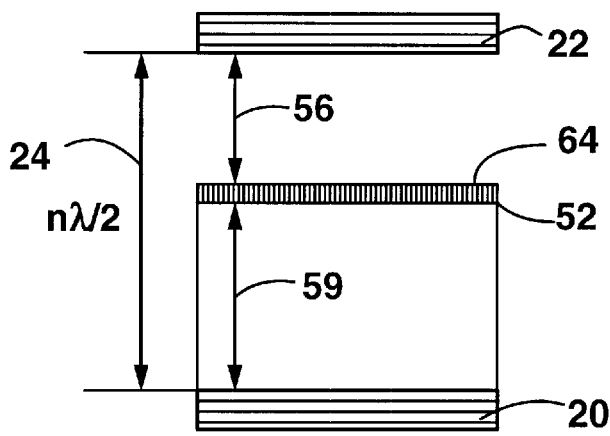

FIG. 6c shows a cavity design known as an extended cavity. The entire cavity length 24 is equal to an integral number of half wavelengths, or $n\lambda/2$, as in a normal tuned etalon. An antireflection coating 64 is disposed on the top surface 52. Optical energy propagates freely between the air gap 56 and solid state gap 59. The tuning of an extended cavity is moderately sensitive to changes in the air gap 56, compared to the air coupled cavity and semiconductor coupled cavity of FIGS. 6a and 6b.

Figure 7:
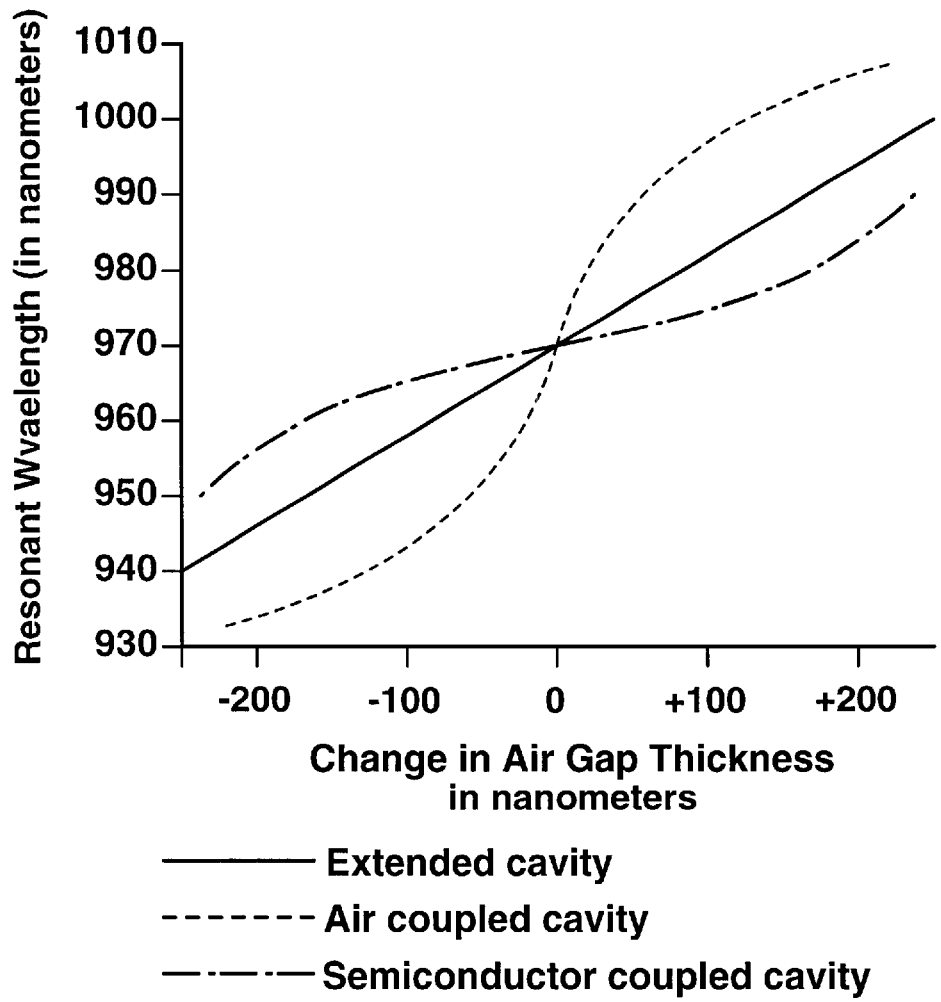
FIG. 7 is a graph illustrating how the different cavity designs respond to cavity length changes.

FIG. 7 is a graph illustrating the relative tuning sensitivity of air coupled cavities, semiconductor coupled cavities and solid state coupled cavities. It is understood that a partial antireflection coating on the top surface 52 can produce a device with characteristics intermediate between the air-coupled, semiconductor-coupled, and extended cavity designs.

An advantage of the tunable light detector 50 of FIGS. 4 and 5 is that identical detectors can be used for every detector in a detector array for wavelength division multiplexing applications. Each detector can be tuned to a different wavelength by a different voltage applied between the membrane 54 and top surface 52. This reduces the component redundancy required for reliability because any detector in the array can substitute for any other detector; a back-up detector is not needed for every operating detector. Also, fabricating identical detectors is simpler and more reliable than fabricating graded arrays because it is not necessary to deposit layers of materials with graded composition.

Figure 8:
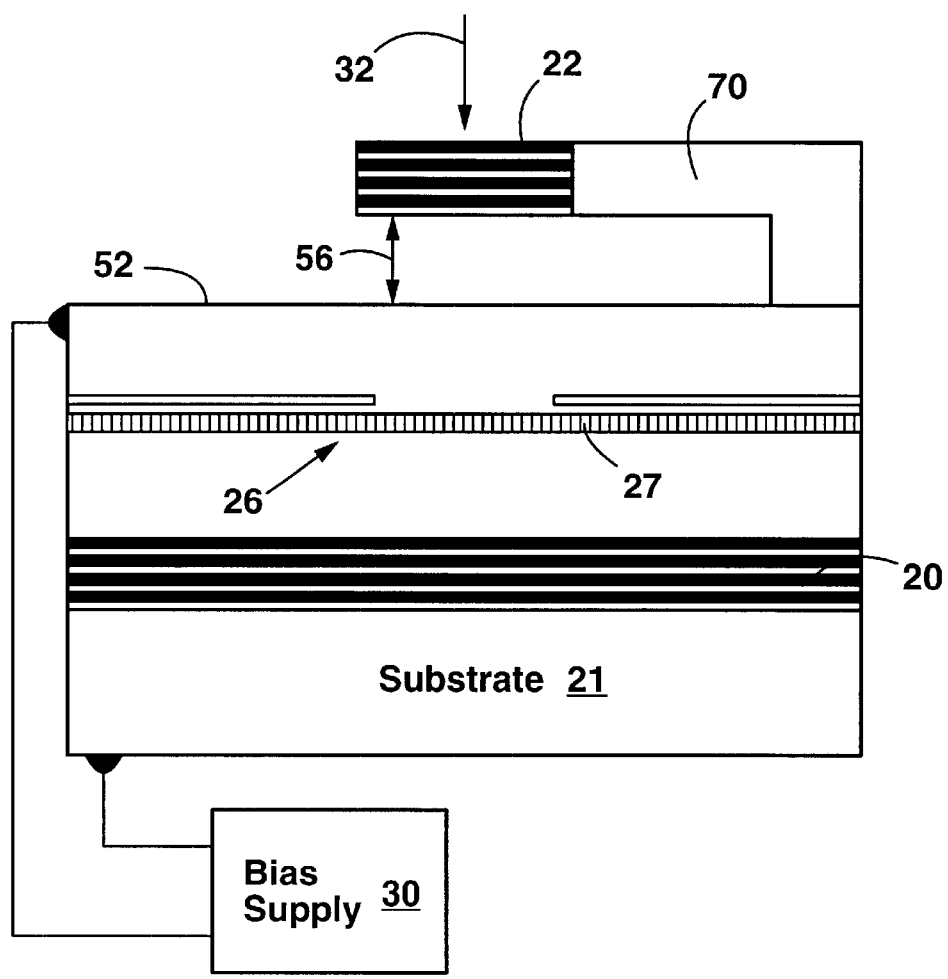
FIG. 8 shows an alternative embodiment which uses a front reflector on the end of a flexible cantilever. Bending the cantilever provides wavelength tuning.

It is noted that the flexible membrane structure shown in FIGS. 4 and 5 is not the only way to make a micromachined tunable etalon. FIG. 8 shows an alternative approach in which the front reflector 22 is suspended above the top surface 52 by a flexible micromachined cantilever 70. The air gap spacing 56 is varied by controlling an electrostatic voltage between the cantilever and top surface 52. One disadvantage with using a cantilever approach is that the linewidth increases as the cantilever is deflected because the front reflector 22 tilts with respect to the back reflector 20. For information concerning the fabrication and operation of the cantilever 70, reference can be made to M. Wu, et al., *IEEE Photonic Technology Letters*, Vol. 8, no. 1, pp. 98–100, 1996, and G. S. Li, et al., *Electronic Letters*, Vol. 33, no 13, pp. 1122–1124, 1997.

The light detectors of the present invention may be made of binary materials such as Aluminum Arsenide (AlAs), Gallium Arsenide (GaAs); ternary materials such as Aluminum Gallium Arsenide (AlGaAs), Indium Gallium Arsenide (InGaAs); or quaternary materials such as Indium Gallium Nitride Arsenide (InGaNAs) or Indium Gallium Arsenide Phosphide (InGaAsP). The appropriate material system depends on the desired resonant wavelength.

Described below are two specific examples of light detectors fabricated according to the present invention. Example 1 uses the semiconductor cavity design and a PIN diode. Example 2 uses the air coupled cavity design and a phototransistor which provides gain. Both examples are fabricated on n+ GaAs substrates.

EXAMPLE 1

The back reflector is a 22.5 period n-doped GaAs/AlAs distributed bragg reflector with a center wavelength near 970 nm and a 99.88% calculated reflectance. The solid state gap is $2\lambda$ thick. The photodetector consists of two 6 nm $In_{0.2}Ga_{0.8}As/10$ nm GaAs quantum wells sandwiched between two $\lambda/2$ spacer layers comprising a $\lambda$ long PIN diode structure. The rest of the solid state gap comprises $\lambda/4$ $Al_{0.3}Ga_{0.7}As$, $\lambda/4$ AlAs, and $\lambda/2$ GaAs layers. The $\lambda/4$ AlAs layer is oxidized to provide a current aperture about 4 microns to 15 microns in diameter. The front reflector consists of $\lambda/4$ GaAs-$\lambda/2$ $Si_3N_4$-2.5 pair $SiO_2/Si_3N_4$ DBR-Gold.

EXAMPLE 2

The front reflector is made $\lambda 0/4$ GaAs-0.674 $\lambda 0$ $Si_3N_4$-150 nm Gold with 99.4% calculated reflectivity at 950 nm, the resonant wavelength. The phototransistor has two 8 nm $In_{0.2}Ga_{0.8}As$ quantum wells and is conservatively placed near a standing wave maximum at the base-collector junction. The optimum back reflector (assuming no cavity absorption, which is valid since we want minimal absorption) is made of a 19.5 pair AlAs/GaAs DBR. The semiconductor cavity is made of typical phototransistor structure, consisting of graded external emitter, N+ emitter $Al_{0.3}Ga_{0.7}As$, graded emitter-base junction, GaAs base, 2–80 nm $In_{0.24}Ga_{0.76}As$ quantum wells, and n-collector.

It will be clear to one skilled in the art that the above embodiment may be altered in many ways without departing from the scope of the invention. Accordingly, the scope of the invention should be determined by the following claims and their legal equivalents.

What is claimed is:

1. An apparatus for detecting light comprising:
   a) a front reflector for receiving incident light to be detected, wherein the front reflector has reflectivity $R_f$;
   b) a back reflector disposed such that it forms an optical resonator with the front reflector, wherein the back reflector has reflectivity $R_b$;
   c) a photodetector disposed between the front reflector and back reflector, wherein the photodetector has a double-pass absorption of A;
   wherein a ratio $R_f/R_b$ is within 10% of the value (1−A).

2. The apparatus of claim 1 wherein Rf is greater than 75%.

3. The apparatus of claim 1 wherein Rf is greater than 90%.

4. The apparatus of claim 1 wherein Rf is greater than 98%.

5. The apparatus of claim 1 wherein a ratio $R_f/R_b$ is within 5% of the value (1−A).

6. The apparatus of claim 1 wherein a ratio $R_f/R_b$ is within 1% of the value (1−A).

7. The apparatus of claim 1 wherein the double pass absorption A is less than 25%.

8. The apparatus of claim 1 wherein the double-pass absorption A is less than 10%.

9. The apparatus of claim 1 wherein the double pass absorption A is less than 5%.

10. The apparatus of claim 1 wherein the double pass absorption A is less than 2%.

11. The apparatus of claim 1 wherein a distance between the front reflector and back reflector is less than 10 microns.

12. The apparatus of claim 1 wherein a distance between the front reflector and back reflector is less than 2 microns.

13. The apparatus of claim 1 wherein the photodetector is selected from the group consisting of PIN photodiodes, phototransistors, avalanche photodiodes, and photodiodes.

14. The apparatus of claim 1 wherein the photodetector comprises an absorptive layer, and wherein the absorptive layer is less than 300 nanometers thick.

15. The apparatus of claim 14 wherein the absorptive layer is less than 100 nanometers thick.

16. The apparatus of claim 14 wherein the absorptive layer is less than 50 nanometers thick.

17. The apparatus of claim 1 wherein at least one of the front reflector and back reflector is movable such that a distance between the front reflector and back reflector is adjustable.

18. The apparatus of claim 1 further comprising a flexible membrane, and wherein the front reflector is attached to the membrane such that a distance between the front reflector and back reflector is changed by flexing the membrane.

19. The apparatus of claim 1 wherein the front reflector is a distributed bragg reflector.

20. The apparatus of claim 1 wherein the back reflector is a distributed bragg reflector.

21. The apparatus of claim 1 wherein the back reflector reflectivity $R_b$ is greater than 99.0%

22. The apparatus of claim 1 wherein the photodetector comprises a quantum well.

* * * * *